(12) United States Patent
Penberth et al.

(10) Patent No.: US 6,288,406 B1
(45) Date of Patent: Sep. 11, 2001

(54) ELECTRON BEAM LITHOGRAPHY SYSTEM HAVING VARIABLE WRITING SPEED

(75) Inventors: Michael J. Penberth; Graham S. Plows; Adam Woolfe, all of Cambridgeshire (GB)

(73) Assignee: DuPont Photomasks, Inc., Round Rock, TX (US)

( * ) Notice: Subject to any disclaimer, the term of this patent is extended or adjusted under 35 U.S.C. 154(b) by 0 days.

(21) Appl. No.: 09/262,639

(22) Filed: Mar. 4, 1999

Related U.S. Application Data

(60) Provisional application No. 60/077,124, filed on Mar. 6, 1998.

(51) Int. Cl.⁷ .................................................. H01J 37/302
(52) U.S. Cl. ...................................... 250/492.22; 430/296
(58) Field of Search .................... 250/492.22; 430/296

(56) References Cited

U.S. PATENT DOCUMENTS 4,870,286 * 9/1989 Tobuse ............................ 250/492.22
5,528,048 * 6/1996 Oae et al. ........................ 250/492.22

FOREIGN PATENT DOCUMENTS 56-165321 * 12/1981 (JP) ................................. 250/492.22

\* cited by examiner

*Primary Examiner*—Jack Berman
(74) *Attorney, Agent, or Firm*—Gray Cary Ware & Freidenrich LLP

(57) ABSTRACT

The approach taken to provide variable writing speeds consists of the following: (1) Software in the Job Control subsystem that Identifies the minimum and maximum valid writing speeds, given the resist sensitivity, maximum beam current density, and requested write address size. if the variable writing speed option is enabled, Job Control selects the maximum valid speed. (2) Software in the Pattern Data Conversion subsystem that determines the number of stripes of pattern figure data to combine into each output bitmap for the selected writing speed. (3) Hardware in the Timing Logic Board to clock bitmap data to the serializer at the desired frequency. (4) Logic in the Blanking device to synchronize its blanking frequency with the clock rate used by the Timing Logic

14 Claims, 3 Drawing Sheets

ELECTRON BEAM LITHOGRAPHY SYSTEM HAVING VARIABLE WRITING SPEED

RELATED INFORMATION

This application claims priority under 35 U.S.C. §119(e)(1) to provisional application No. 60/077,124 filed on Mar. 6, 1998.

TECHNICAL FIELD OF THE INVENTION

The present invention relates to electron beam lithography methods and systems and, more particularly, to a method and system for variably controlling the electron beam writing function of an electron beam lithography instrument.

BACKGROUND OF THE INVENTION

The manufacture of electronic integrated circuits relies heavily on the use of image projection techniques to expose resist-coated wafers with light or X-rays. The patterns formed by this exposure determine the various circuit connections and configurations. In any exposure method, accuracy of the projected image is a prime consideration. This accuracy is particularly important in the manufacture of high density random access memories (RAM) in which the yield and ultimately the cost of the components depend heavily on meeting tight exposure placement requirements. With the increasing demand for high performance integrated circuits, the techniques to fabricate semiconductor substrates for microelectronic devices and other purposes have been undergoing continuous development and now include the use of scanning-electron beam lithography systems, both for producing high quality lithographic masks and for direct pattern generation.

Electron beam lithography systems use electron sources that emit electrons at all angles. The electrons are then constrained by the remainder of the system into a narrowly diverging beam. Succeeding lenses then focus the beam into one or more cross-overs before the beam reaches the target. In these systems, electron beams are formed by an electron beam column that, at a minimum, includes an electron source at an object plane and a target at the image plane. Usually the electron beam column includes at least an electron source at the object plane, one or more lenses, one or more apertures, and the target at the image plane. Columns for electron beam lithographic mask exposure include at least an electron source at the object plane, one or more lenses, one or more apertures, one or more deflectors, a set of beam blankers (which can be driven to stop the beam reaching the target), and a target at the image or mask plane.

In direct pattern generation where the electron beam system creates a pattern directly on a chip covered with resist material, the often complicated and time consuming mask-making process is eliminated. However, one of the key economic considerations in a direct electron beam lithography system for a production environment is the throughput achieved by direct writing relative to a system using a series of masks. This is of particular importance, because direct writing is necessarily a serial output process. Hence, time constraints become even more critical in direct pattern generation.

As manufacturers seek ever higher writing speeds, other significant problems also appear. These problems arise often as a result of the relationship among these various parameters. For example, as the writing speed increases, the current density must be increased to maintain the same exposure on the resist. However, higher current densities lead to beam broadening due to electron-electron interactions, thereby deleteriously increasing the line width. Also, a shortened exposure time further requires a shortened blanking time, since the rise time of the blanker is closely related to the accuracy of the exposure of each pixel, and is also a major concern in avoiding extraneous exposure during blanking. Hence, blanking time in raster scan type electron beam devices remains one of the key factors limiting throughput.

The electron optical column delivers a variable sized spot with constant current density, the spot current increasing as the square of spot size. Correct resist exposure requires a certain number of coulombs per unit area. From the resist sensitivity and beam current density we can obtain the time required to expose the area covered by the spot. The time taken to expose a mask is this time multiplied by the mask area divided by the spot area.

For the purpose of understanding the description of the invention, assume the spot to be square, equal to the address grid, and all the mask area to be rastered. For a beam current density J and resist sensitivity S the exposure time per spot (pixel rate) is S/J secs. The given variable is resist sensitivity, beam current density and pixel exposure rate must be matched to achieve the correct dosage.

Over much of the operating range the MEBES machine is not making best use of the available beam current.

SUMMARY OF THE INVENTION

In light of the above, electron beam lithography system that provides variable writing speed, that eliminates or reduces the above-identified limitations of the prior art.

The approach taken to provide variable writing speeds consists of the following:

Software in the Job Control subsystem that Identifies the minimum and maximum valid writing speeds, given the resist sensitivity, maximum beam current density, and requested write address size. if the variable writing speed option is enabled, Job Control selects the maximum valid speed.

Software in the Pattern Data Conversion subsystem that determines the number of stripes of pattern figure data to combine into each output bitmap for the selected writing speed.

Hardware in the Timing Logic Board to clock bitmap data to the serializer at the desired frequency.

Logic in the Blanking device to synchronize its blanking frequency with the clock rate used by the Timing Logic Board.

Where there is insufficient beam current density to write at maximum clock rate exposure times can be improved over the MEBES scheme by introducing a fully variable clock rate. The reduction in exposure time can be as much as 50%.

Where beam current density is more than adequate better utilization can be achieved by increasing the choice in number of pixels per write scan.

Improvements in exposure time over MEBES range up to 40%.

Making the change to variable exposure clock and pattern stripes per write stripe has implications for both software and hardware.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs like numerals being used to refer to like and corresponding parts of the various drawings.

Figure 1:
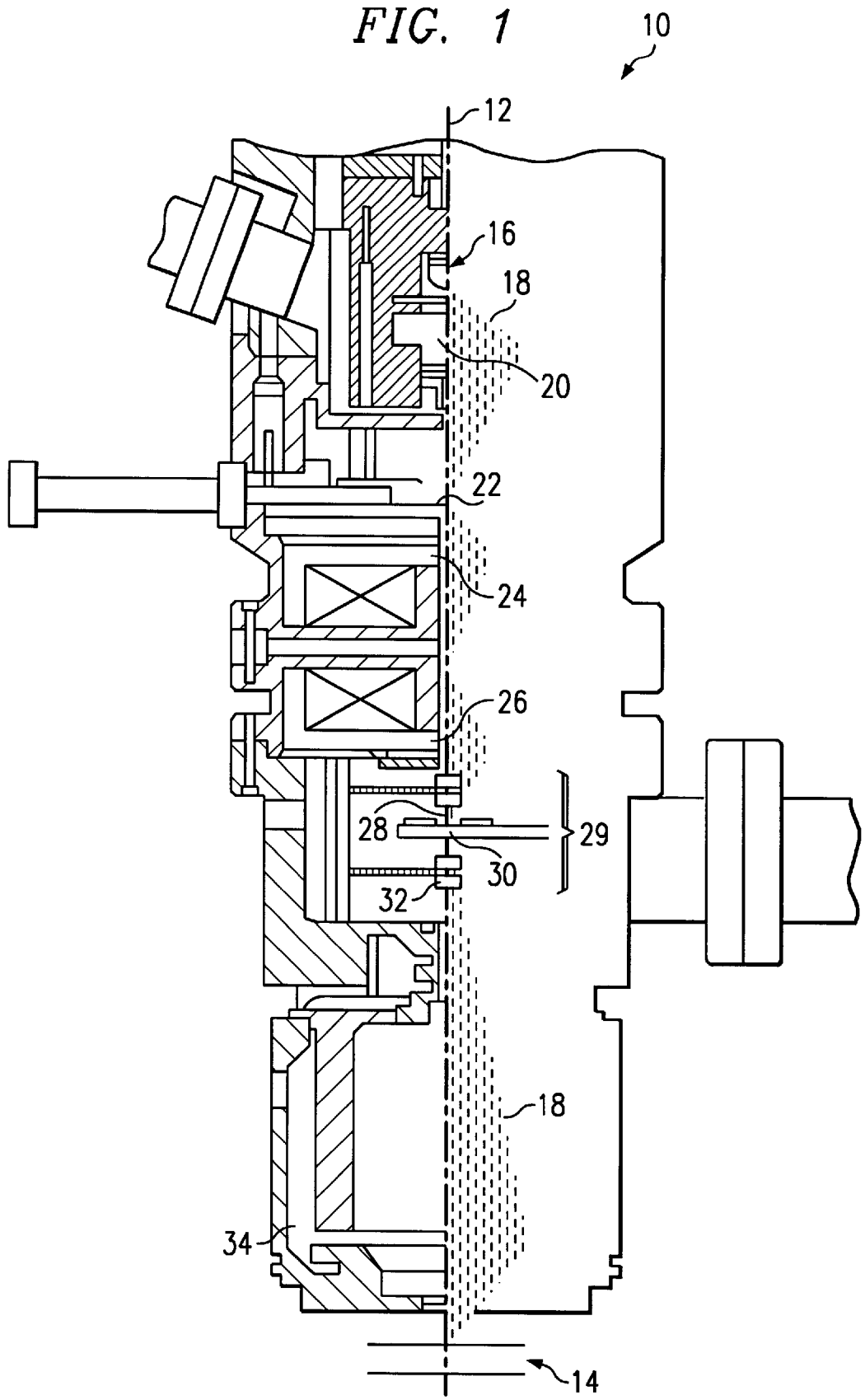
FIG. 1 shows a side cut-away schematic view of an electron beam lithography system incorporating the teachings of the present invention.

For general understanding of the invention, it is helpful to see the relationship for the blanker to the other elements of an electron beam lithography column. To that end, FIG. 1 shows a side cut-away schematic view of electron beam lithography system 10 incorporating the teachings of the present invention. Electrons are provided in the column by a cathode which is a thermal field emission electron source 16 much as described in U.S. Pat. No. 3,374,386 entitled FIELD EMISSION CATHODE HAVING TUNGSTEN MILLER INDICES 100 PLAIN COATED WITH ZIRCONIUM, HAFNIUM OR MAGNESIUM ON OXYGEN BINDERS, issued to Charbonnier, et al., in 1968. FIG. 1 shows only half of the column cross-section on the left-hand side of dash line 12. On the right-hand side of dash line 12 appears the electron beam divergence and covergence path enroute to target lithographic mask 14, however, with the lateral dimensions vastly exaggerated. The electron beam appearing in FIG. 1, therefore, is fairly realistic assuming that the lateral dimension is several thousand times the vertical dimension.

In FIG. 1, electron beam lithography system 10 includes high reliability thermal field emission tip 16 that emits a beam of electrons that eventually flow in the direction of lithographic mask 14. From thermal field emission tip 16, electron beam 18 passes through magnetic lens 20 which focuses the beam at the center of electron beam lithography system 10 and directs electron beam 18 through system limiting aperture 22. Aperture 22 further aligns electron beam 18 with the optical axis to provide the proper beam shape before electrons enter blanking device 29.

After passing through system limiting aperture 22, electron beam 18 goes through first magnetic lens 24 and then through second magnetic lens 26 until it reaches upper plates 28 of electron beam blanking device 29 of the present invention. Upper deflection plate set 28 deflects electron beam 18 through blanking aperture 30. From blanking aperture 30, electron beam 18 passes through lower deflection plates 32 of the present invention, which realigns electronic beam 18 upon its exit from blanking device 29.

Figure 2:
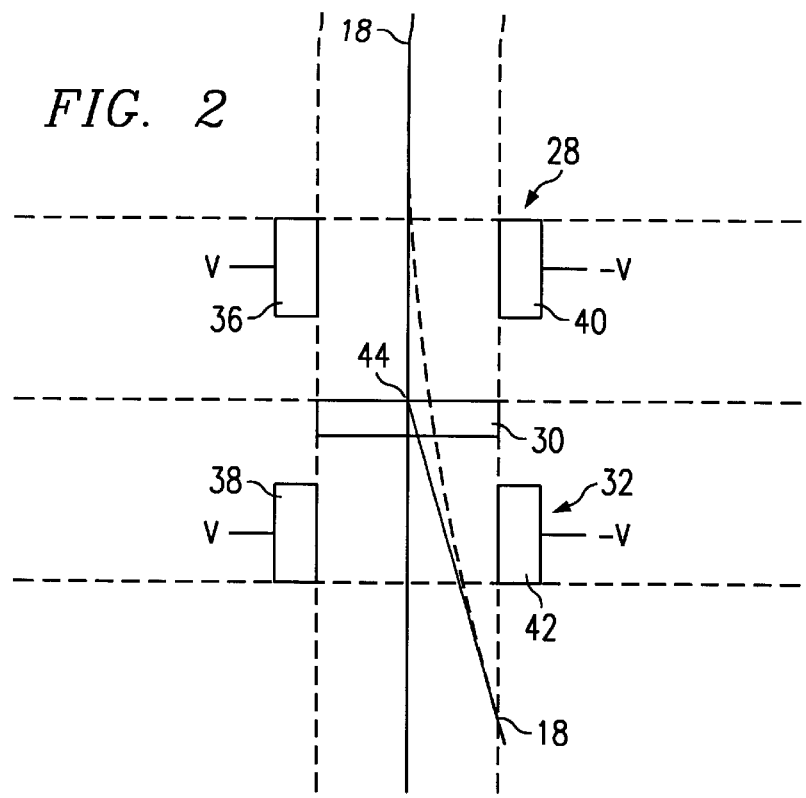
FIG. 2 illustrates conceptually the deflection function occurring in the present invention.

FIG. 2 illustrates conceptually the deflection and beam blanking function that blanking device 29 performs. In FIG. 2, an equal voltage, V(t), is driven first positively to upper plate 36 of upper plate set 28 and then to lower plate 38 of lower plate set 32. The deflection voltage, V(t), is the applied negatively to upper plate 40 of upper plate set 28 and lower plate 42 of lower set deflection plate 32. Blanking aperture 30 is placed midway between plate set 28 and lower plate set 32. This causes electron beam 18 to appear as though it emerges from point 44 of aperture 30 which is the axial point located centrally between the centers of upper deflection plate set 28 and lower deflection plate set 32. The blanking aperture 30 blanks electron beam 18 as soon as its deflection causes it to fall completely outside the blanking aperture opening. Until electron beam 18 is completely blanked, however, it appears, at all deflection angles, to emerge from blanking device 29 as though from blanking aperture 30.

Figure 3:
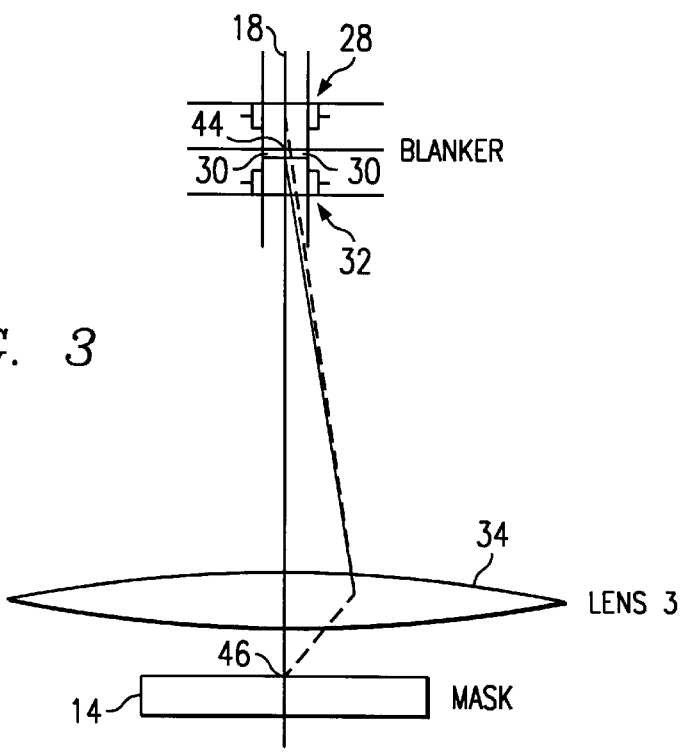
FIG. 3 depicts the magnetic focusing of an electron beam from the deflection system of the present invention to a lithographic mask for the purpose of electron beam lithography.

FIG. 3 depicts the magnetic focusing of electron beam 18 from electron beam lithography system 10 of the present invention to point 46 on lithographic mask. FIG. 3 illustrates an object of the present invention of assuring that the aperture 30 position is optically conjugate with the mask 14 surface so that point electron 46 on mask 14 remains stationary during blanking. Stated otherwise, the object at the blanking aperture is imaged at the mask 14 surface. Therefore, within the limits of a paraxial approximation of electron optics, any ray which appears to emerge from the blanking aperture is brought to the same image point in the mask plane, irrespective of the angle at which it emerges from lower deflection plate set 32.

U.S. patent application Ser. No. 60/076,889, entitled "ELECTRON BEAM BLANKING METHOD AND SYSTEM FOR ELECTRON BEAM LITHOGRAPHIC PROCESSING" filed on Mar. 5, 1998 by G. Plows, et al., and assigned to DuPont Photomasks, Inc. (hereinafter "Plows") describes a method and system that substantially improves blanking stability of an electron beam lithography system even at raster scan speeds of 300 MHZ and more. The present invention has application in such a system having improved methods of operation for raster scan operations. Accordingly, Plows is here expressly incorporated by reference to any and all extent necessary, including to the extent necessary to illustrate the preferred use of the present invention.

The electron optical column delivers a variable sized spot with constant current density, the spot current increasing as the square of spot size. Correct resist exposure requires a certain number of coulombs per unit area. From the resist sensitivity and beam current density we can obtain the time required to expose the area covered by the spot. The time taken to expose a mask is this time multiplied by the mask area divided by the spot area.

For the purpose of this discussion we assume the spot to be square, equal to the address grid, and all the mask area to be rastered. For a beam current density J and resist sensitivity S the exposure time per spot (pixel rate) is S/J secs. The given variable is resist sensitivity, beam current density and pixel exposure rate must be matched to achieve the correct dosage.

Figure 4:
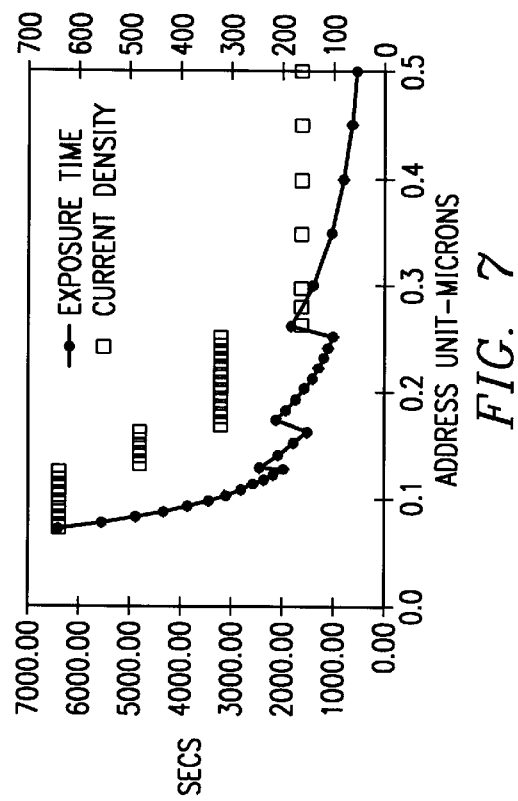
FIG. 4 above shows the relationship resist sensitivity, beam current density and pixel exposure rate for 320 MHZ and 160 MHZ operation.

FIG. 4 above shows the relationship resist sensitivity, beam current density and pixel exposure rate for 320 MHZ and 160 MHZ operation. Mask exposure time for a 10 cm by 10 cm area at 320 MHZ clock rate is:

$$3.125e-9 * 1e5/(au)^2 \text{ sec}$$

where au=address unit in microns. For an address unit of 0.25 micron total exposure time would be 500 secs and at 0.125 microns 2000 secs.

3. LIMITATIONS ON THE IDEAL

A number of practical issues act to reduce the throughput to less than the ideal, we will ignore some such as stage movement times, re-registration, etc., and concentrate on the more fundamental aspects of raster scanning.

3.1 Maximum Deflection Rate.

The slew rate of the write scan is the address unit times the pixel rate or:

$$au*clock*1e-3 \text{ mm/sec}$$

where clock=pixel rate. There is a practical limit placed on this by the design of the deflection system, the limit is 40,000 mm/sec imposed by the 1 mm deflection limit and 25.6 usec ramp time. The maximum rate of area coverage is then:

$$4000*au*1e-4 \text{ sq. cm/sec}$$

where au is in microns. But area coverage is also given by:

$$(au)^2*1e-8/(S/J) \text{ sq. cm/sec}$$

for correct exposure dose. At higher values of address unit the maximum deflection rate will limit the rate of area coverage and J may have to be reduced to less than that available to obtain the required exposure dose.

For 0.25 micron address and 2 uC/sq. cm resist sensitivity the beam current density must be set to:

$$J=S,*4000*1e-4/((au)*1e-8)=320 \text{ Amps/sq. cm}$$

With an area coverage rate limited to 0.4*au sq. cm/sec our 10 cm by 10 cm mask takes 1000 secs at 0.25 micron address against the ideal 500 calculated earlier.

3.2 Address Unit/Clock Rate combinations.

The MEBES system runs with a fixed write scan time of 25.6 usec and clock rates of 40, 80, and 160 MHZ with 320 MHZ as a future option. The result is an upper limit on address unit for each clock rate arising from the 1 mm limit on write scan height. This limit is 0.125 micron at 320 MHZ, 0.25 micron at 160 MHZ, etc.

We can establish a further set of area coverage relationships, this time for clock rate:

$$\text{Area coverage}=(au)^2*1e-8*clock \text{ sq. cm/sec}$$

Again, we can match this to correct exposure dose:

$$(au)^2*1-e-8/(S/J)=(au)^2*1e-8*clock$$

or $$J/S=clock$$

With a further re-arrangement of these expressions we can arrive at an expression for our 10 cm by 10 cm mask exposure time of:

$$(100/((au)^2*1e-8))/(J/S) \text{ secs}$$

For (au) less than 0.125 microns J/S may assume any permitted value up to 320 MHZ, between 0.125 and 0.25 microns J/S must be 160 MHZ or below, and above 0.25 microns J/S must be 80 MHZ or below. For a fixed value of resist sensitivity, S, J must be reduced in steps as address size increases. Running with less than the available beam current density represents a throughput inefficiency.

Figure 5:
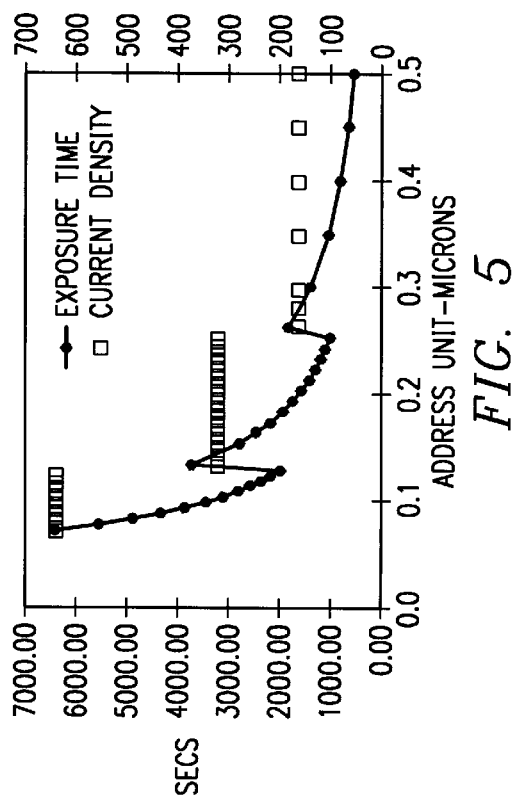
FIG. 5 shows the exposure time and current density relationship to address unit for 2 uC-cm$^2$ resist sensitivity.

FIG. 5 shows the exposure time and current density relationship to address unit for 2 uCsq. cm resist sensitivity.

4. ALLOWING VARIABLE CLOCK RATE

The inefficiency of the MEBES type fixed clock rate may be reduced by allowing a fully variable clock rate. This may also be combined with a change to the pixel per write scan structure for further improvement.

4.1 With MEBES Pixel Per Write Stripe Structure

The MEBES write data structure has 8192 pixels per write scan at 320 MHZ, 4096 at 160 MHZ, etc. Writing above these clock rates would require a write scan shorter than the 25.6 usec of the current design. Limitations in the deflection amplifiers and coils mean that this is not practical. The clock may be slowed, scan time increased to some advantage for less sensitive resists where the beam current density called for at maximum clock rate may be beyond that available. This is an issue below 0.125 micron address where 320 MHZ operation is possible.

Figure 6:
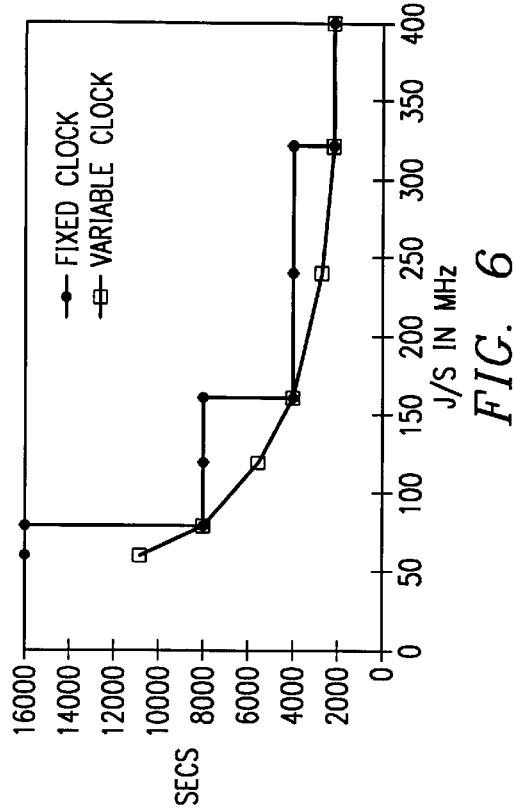
FIGS. 6 and 7 show exposure time against the maximum available clock rate computed from the maximum beam current density divided by the resist sensitivity.

FIG. 6 is for 0.125 micron address unit and shows the 10 cm by 10 cm exposure time against the maximum available clock rate computed from the maximum beam current density divided by the resist sensitivity. For low sensitivity resists where there is insufficient beam current density to operate at the MEBES frequencies a variable clock can improve exposure times by as much as 50%.

4.2 Changing the Write Stripe Structure

Figure 7:
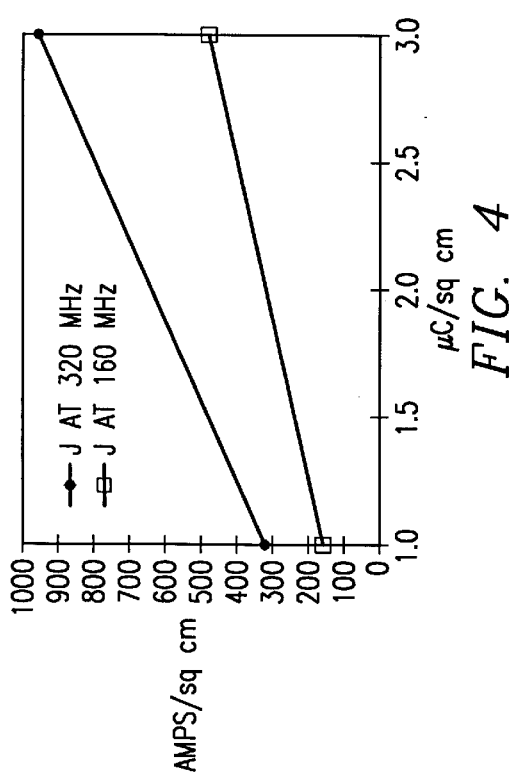

Pattern data is organized in stripes 1024 pixels high, these pattern stripes are then organized into write stripes consisting of 1024, 2048, 4096, or 8192 pixels. If, say, 6144 were allowed a clock rate of 240 MHZ would be achievable for address sizes up to 0.163 microns. The effect of this on exposure time can be seen by comparing FIG. 7 with FIG. 6.

Between 0.125 and 0.163 microns exposure time is reduced by 33% because of better utilization of the available current density. The scheme can be extended to give further improvement by including 3072, 5120 and 7168 as write stripe options.

Variable-speed writing is a phrase that describes the ability to determine the most effective writing speed at the time that a job is being run. There are three primary variables that affect the writing speed:

Resist Sensitivity.

Each substrate is coated with a film of electrically sensitive material. When this material is subjected to a certain level of electrical charge density from the beam, the affected-area is exposed. The level of charge density needed to expose tile material is called its resist sensitivity. in commercial electron-beam lithography systems, resist sensitivities are commonly in the range of 2.5 micro-coloumbs/ square centimeter.

Maximum Beam Current Density

The design of the electron-beam column constrains the maximum current that the beam can deliver per unit of area. Since, the writing speed determines the length of time that an area on the substrate is exposed, doubling the writing speed while at the maximum beam current density has the effect of cutting the electrical dose in half.

Maximum Deflection Scan Length

The nominal length of a write scan line is the product of the write address size and the number of pixels in a write scan line. The number of pixels per scan line is a function of writing speed: 1024 pixels for each 40 MHz of write speed. In addition, the deflection system used in the Mebes III system has a design limitation that limits the length of a write scan line to 1 mm or less.

The combined effect of these three variables is that for a given resist sensitivity and maximum beam current density, there is a maximum writing speed (in order to deliver electrical dose equal to the resist sensitivity). In addition, for a specific writing speed, there is a maximum write address size (to remain within the 1 mm deflection scan limit). For example, at 320 MHz, the maximum write address size is 0.125 micrometer; 0.25 micrometer produces a write scan length of 2 mm.

When the desired writing speed is incompatible with the sensitivity of the resist, the beam current density and the desired write address size, it is necessary to reduce the writing speed. All other factors being equal, reducing the writing speed by half doubles the time needed to write the job.

The main advantage of variable writing speeds is that the system can offer a larger selection of speeds. For example, in addition to 80, 160, and 320 MHz, we also are able to offer 120, 200, 240, and 280 MHz. This means, that a write address size of 0.15 micrometers (which is too large to write at 320 MHz) can be written at 240 MHz instead of 160 MHz. This means that the total exposure time increases by 33% instead of 100%.

The approach taken to provide variable writing speeds consists of the following. Software in the Job Control subsystem that Identifies the minimum and maximum valid writing speeds, given the resist sensitivity, maximum beam current density, and requested write address size. if the variable writing speed option is enabled, Job Control selects the maximum valid speed.

Software in the Pattern Data Conversion subsystem that determines the number of stripes of pattern figure data to combine into each output bitmap for the selected writing speed. Hardware in the Timing Logic Board to clock bitmap data to the serializer at the desired frequency. Logic in the Blanking device to synchronize its blanking frequency with the clock rate used by the Timing Logic Board.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method for variably controlling the electron beam writing function of an electron beam lithography instrument that performs electron beam lithography in forming an electronic device, comprising the steps of:
   identifying a minimum valid writing speed and a maximum valid writing speed for the electron beam lithography instrument;
   enabling a variable write speed signal to the electron beam lithography instrument;
   selecting said maximum valid writing speed in response to enabling said variable write speed signal;
   determining the number of stripes of pattern figure data for combining into a set of output bitmaps for a selected writing speed;
   clocking bitmap data to a serializer at the selected writing speed; and
   synchronizing the blanking frequency with said bitmap data clocking step.

2. The method of claim 1, wherein said step of identifying a minimum valid writing speed and a maximum valid writing speed for the electron beam lithography instrument further comprises the step of identifying said minimum valid writing speed and said maximum valid writing speed considering the resist sensitivity of the electronic device.

3. The method of claim 1, wherein said step of identifying a minimum valid writing speed and a maximum valid writing speed for the electron beam lithography instrument further comprises the step of identifying said minimum valid writing speed and said maximum valid writing speed considering the maximum beam current density for the electron beam generated by the electron beam lithography instrument.

4. The method of claim 1, wherein said step of identifying a minimum valid writing speed and a maximum valid writing speed for the electron beam lithography instrument further comprises the step of identifying said minimum valid writing speed and said maximum valid writing speed considering the desired write address size for the electronic device.

5. The method of claim 1, wherein said enabling step further comprises enabling a variable write speed signal to the electron beam lithography instrument using a job control set of instruments in a control program associated with said electron beam lithography instrument.

6. The method of claim 1, wherein said determining step further comprises the step of determining the number of stripes of pattern figure data for combining into a set of output bitmaps for a selected writing speed using a set of pattern data conversion instructions associated with said job control instructions.

7. The method of claim 1, wherein said clocking step and said synchronizing step further comprise the steps of performing said steps on a Timing Logic circuit.

8. A system for variably controlling the electron beam writing function of an electron beam lithography instrument that performs electron beam lithography in forming an electronic device, comprising the steps of:
   instructions for identifying a minimum valid writing speed and a maximum valid writing speed for the electron beam lithography instrument;
   instructions for enabling a variable write speed signal to the electron beam lithography instrument;
   instructions for selecting said maximum valid writing speed in response to enabling said variable write speed signal;
   instructions for determining the number of stripes of pattern figure data for combining into a set of output bitmaps for a selected writing speed;
   instructions for clocking bitmap data to a serializer at the selected writing speed; and
   instructions synchronizing the blanking frequency with said bitmap data clocking step.

9. The system of claim 8, wherein said instructions for identifying a minimum valid writing speed and a maximum valid writing speed for the electron beam lithography instrument further comprise instructions for identifying said minimum valid writing speed and said maximum valid writing speed considering the resist sensitivity of the electronic device.

10. The system of claim 8, wherein said instructions for identifying a minimum valid writing speed and a maximum valid writing speed for the electron beam lithography instrument further comprise instructions for identifying said minimum valid writing speed and said maximum valid writing speed considering the maximum beam current density for the electron beam generated by the electron beam lithography instrument.

11. The system of claim 8, wherein said instructions for identifying a minimum valid writing speed and a maximum valid writing speed for the electron beam lithography instrument further comprise instructions for identifying said minimum valid writing speed and said maximum valid writing speed considering the desired write address size for the electronic device.

12. The system of claim 8, wherein said enabling instructions further comprise instructions for enabling a variable write speed signal to the electron beam lithography instrument using a job control set of instruments in a control program associated with said electron beam lithography instrument.

13. The system of claim 8, wherein said determining instructions further comprise instructions for determining the number of stripes of pattern figure data for combining into a set of output bitmaps for a selected writing speed using a set of pattern data conversion instructions associated with said job control instructions.

14. The system of claim 8, wherein said clocking instructions and said synchronizing instructions further associate with a timing logic circuit.

* * * * *